United States Patent
Shrivastava et al.

(10) Patent No.: US 6,373,089 B1
(45) Date of Patent: Apr. 16, 2002

(54) DRAM CELL HAVING STORAGE CAPACITOR CONTACT SELF-ALIGNED TO BIT LINES AND WORD LINES

(75) Inventors: Ritu Shrivastava, Fremont; Chitranjan N. Reddy, Los Altos Hills, both of CA (US)

(73) Assignee: Alliance Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/637,322

(22) Filed: Aug. 10, 2000

Related U.S. Application Data (63) Continuation of application No. 09/391,853, filed on Sep. 8, 1999, now abandoned, which is a continuation of application No. 08/754,391, filed on Nov. 21, 1996, now Pat. No. 5,994,730.

(51) Int. Cl.$^7$ .............................................. H01L 27/108
(52) U.S. Cl. ........................ 257/306; 257/296; 257/649
(58) Field of Search ................................ 257/306, 307, 257/308, 309, 310, 311, 296, 300, 635, 637, 640, 649, 758

(56) References Cited

U.S. PATENT DOCUMENTS

| | | |
|---|---|---|
| 5,053,351 A | 10/1991 | Fazan et al. |
| 5,188,975 A | 2/1993 | Kojima et al. |
| 5,231,043 A | 7/1993 | Chan |
| 5,428,235 A | 6/1995 | Shimizu et al. |
| 5,434,812 A | 7/1995 | Tseng |
| 5,459,345 A | 10/1995 | Okudairs et al. |
| 5,486,712 A | 1/1996 | Arima |
| 5,504,704 A | 4/1996 | Sato et al. |
| 5,539,230 A | 7/1996 | Cronin |
| 5,629,540 A | 5/1997 | Roh et al. |
| 5,696,395 A | 12/1997 | Tseng |
| 5,705,838 A | 1/1998 | Jost et al. |

OTHER PUBLICATIONS

"Fully Self–Aligned 6F$^2$ Cell Technology for Low Cost 1 Gb DRAM," by Masami Aoki, et al., 1996 Symposium on VLSI Technology Digest of Technical Papers, pp. 22–23, 1996.

"3–Dimensional Stacked Capacitor Cell for 16M and 64M DRAMS" by T. Ema, et al., IEDM, 1988, pp. 592–595.

*Primary Examiner*—Minh Loan Tran
(74) *Attorney, Agent, or Firm*—Beyer Weaver & Thomas LLP (57) ABSTRACT

A DRAM cell (10) having a capacitor-over-bit line (COB) structure self-aligned to the word lines and bit lines is disclosed. Word lines (24) and bit lines (28) are formed with insulating structures that include insulating sidewalls. The word line insulating structure includes an etch barrier layer (46) that extends over a source region (18). A first interlayer dielectric (ILD) (48) insulates the word lines (24) from the bit lines (28) and a second ILD (60) insulates the bit lines from a cell capacitor. A capacitor contact hole (34), self-aligned with the bit lines and the word lines, is formed by etching through the first and second ILDs (48 and 60) to expose the etch barrier layer (46) over the source region (18). Portions of the bit line and word line exposed by the etch are protected by their respective insulating structures. The exposed etch barrier layer (46) over the source region (18) is cleared and a storage capacitor is formed having a contact that extends into the contact hole to make contact with the source region (18).

5 Claims, 12 Drawing Sheets

DRAM CELL HAVING STORAGE CAPACITOR CONTACT SELF-ALIGNED TO BIT LINES AND WORD LINES

This is a Continuation application of prior application Ser. No. 09/391,853 filed on Sep. 8, 1999, now abandoned, which is a continuation of prior application Ser. No. 08/754,391 filed on Nov. 21, 1996 and issued as U.S. Pat. No. 5,994,730, the disclosures of which are incorporated herein by reference.

TECHNICAL FIELD

The present invention relates generally to the fabrication of dynamic random access memories (DRAM), and more particularly to DRAM stacked cell capacitor (STC) contacts in a capacitor-over-bit line (COB) DRAM cell structure.

BACKGROUND OF THE INVENTION

The drive for increasing DRAM densities has given rise to a number of different DRAM cell configurations. One way in which to classify DRAM cells having capacitors formed above the substrate, is to designate the vertical position (layer) of the storage capacitor relative to the vertical position (layer) of the bit line. This gives rise to two, general, self-descriptive groups; bit line-over-capacitor (BOC) cells, and capacitor-over-bit line (COB) cells. For BOC cells, the bit line contact is formed by etching a contact hole after the storage capacitor has been formed. As a result, the location of the bit line can limit the lateral extent of the storage capacitor. An example of a BOC cell is set forth in "3-DIMENSIONAL STACKED CAPACITOR CELL FOR 16M AND 64M DRAMS" by Ema et al. appearing in *IEDM* 1988, pp. 592–595. The BOC cell appears in FIG. 1 of Ema et al. Other examples of BOC cells are set forth in U.S. Pat. No. 5,504,704 entitled SEMICONDUCTOR MEMORY DEVICE and issued to Sato et al. on Apr. 2, 1996, U.S. Pat. No. 5,188,975 entitled METHOD OF PRODUCING A CONNECTION HOLE FOR A DRAM HAVING AT LEAST THREE CONDUCTOR LAYERS IN A SELF ALIGNMENT MANNER issued to Kojima et al. on February, and in "Fully Self-Aligned 6F2 Cell Technology for Low Cost 1 Gb DRAM" by Aoki et al. appearing in 1996 *Symposium on VLSI Technology Digest of Technical Papers*, pp. 22–23.

Unlike most BOC cells, COB cells provide more lateral room for the location of the storage capacitor. An illustration contrasting a COB cell with a BOC cell is set forth in FIG. 11 of Ema et al. The capacitor of the COB cell extends over both the access transistor gate and the bit line, and is limited in the lateral direction only by the adjacent storage capacitor.

Examples of other COB cells are disclosed in U.S. Pat. No. 5,428,235 entitled SEMICONDUCTOR MEMORY DEVICE INCLUDING IMPROVED CONNECTION STRUCTURE TO FET ELEMENTS and issued to Shimizu et al. on Jun. 27, 1995, U.S. Pat. No. 5,231,043 entitled CONTACT ALIGNMENT FOR INTEGRATED CIRCUITS issued to Chan et al. on Jul. 27, 1996, and in U.S. Pat. No. 5,053,351 entitled METHOD OF MAKING STACKED E-CELL CAPACITOR DRAM CELL issued to Fazan et al. on Oct. 1, 1991.

As DRAM densities continue to shrink, more complex manufacturing processes utilizing multiple conductive layers are needed to achieve acceptable cell capacitance while reducing DRAM cell size. This requires minimum tolerances in the placement of contacts and/or vias with respect to underlying conductive layers. Despite minimum tolerances, the possibility of unwanted shorts between the contact/vias and underlying layers is eliminated by ensuring that sufficient interlayer dielectric thickness exists therebetween. In order to reduce such tolerances, it is known in the prior art to use self-alignment techniques for both BOC and COB cells. Self-alignment techniques typically ensure that lower conductive layers are sufficiently insulated so as to allow for the overlap of a subsequently etched contact hole or via. For example, in the Kojima et al. patent and the Aoki et al. article, both the capacitor contacts and the bit line are self-aligned with the word lines. In both of these cases the word lines are isolated by a top dielectric and sidewall dielectrics. In the Chan et al. patent, differential dielectric deposition techniques followed by a blanket anisotropic etch, are used to form a self-aligned capacitor contact.

Commonly owned, copending U.S. patent application Ser. No. 08/456,090 discloses a BOC DRAM cell having a capacitor contact that is self-aligned with a word line, and provides increased capacitance.

Increasing the number of self-aligned steps used in the fabrication of an integrated circuit reduces the constraints on the placement of underlying layers, allowing for more compact designs and thus higher densities.

SUMMARY OF THE INVENTION

It is an object of the present invention to provide DRAM cell with reduced cell area.

It is another object of the present invention to provide a DRAM cell having increased capacitance.

It is another object of the present invention to provide a COB DRAM cell having greater tolerances for placement of the capacitor contact.

A preferred embodiment of the present invention is a DRAM memory cell having an access transistor and storage capacitor. The DRAM cell has a COB configuration with the storage capacitor contact being simultaneously self-aligned with the bit line and word line of the cell. Word lines and bit lines are formed with an insulating structure that includes a top dielectric layer and sidewall dielectric spacers. An etch stop layer is formed over the word lines and the drains of the access transistors. Interlayer dielectrics (ILDs) provide vertical isolation of the word lines from the bit lines, and the bit lines from the storage capacitor. The etch used to clear the self-aligned capacitor contact hole includes a first etch, selective to the etch stop layer, which clears a contact hole down to the etch stop layer. The etch stop layer protects the word lines from the first etch. A second etch, selective to the ILDs is used to clear the access transistor source surface. The bit lines and the word lines are protected from the second etch by their respective insulating structures. The capacitor storage node is then formed that is self-aligned with the access transistor source.

According to one aspect of the present invention, the first etch layer and the insulating structure surrounding the bit lines are composed of silicon nitride, and the insulating structure surrounding the word lines and the ILD layers is composed of silicon dioxide. The first etch is selective to silicon nitride, and the second etch step is selective to silicon dioxide.

According to another aspect of the present invention, the insulating structure surrounding the word lines includes a first top layer of silicon dioxide, sidewall spacers of silicon dioxide, and a second layer top layer of silicon nitride.

An advantage of the present invention is that it provides a DRAM cell with a capacitor contact that is self-aligned with the array bit lines and word lines.

Another advantage of the present invention is that it provides a DRAM cell with a capacitor of increased capacitance that has a contact that is self-aligned with the bit line and the word line.

Another advantage of the present invention is that it provides a DRAM cell having a self-aligned capacitor contact that can be formed utilizing conventional capacitor contact masks.

Other objects and advantages of the present invention will become apparent in light of the following description thereof.

DETAILED DESCRIPTION OF THE EMBODIMENTS

A preferred embodiment of the present invention is a DRAM cell having a capacitor-over-bit line arrangement. The DRAM cell is intended to be repeated numerous times on a semiconductor so as to form one or more memory cell arrays in a DRAM integrated circuit device. Two DRAM cells sharing a common bit line are set forth in a top plan view in FIG. 1. The DRAM cells are designated by the general reference characters 10a and 10b. In the top plan view of FIG. 1 a top capacitor plate that covers both DRAM cells (10a and 10b) has been omitted to more clearly illustrate the various underlying elements of the DRAM cells (10a and 10b). The DRAM cells (10a and 10b) are arranged essentially as mirror images of one another, and so include the same general elements. Like elements will be referred to by the same reference number, with the letter "a" or "b" indicating which DRAM cell the element belongs to (10a or 10b). The DRAM cells (10a and 10b) are fabricated on a semiconductor substrate 12 that includes an active area 14 surrounded by isolation regions 16. In the preferred embodiment the active area is n-type silicon and the isolation regions are thermally grown silicon dioxide.

Figure 1:
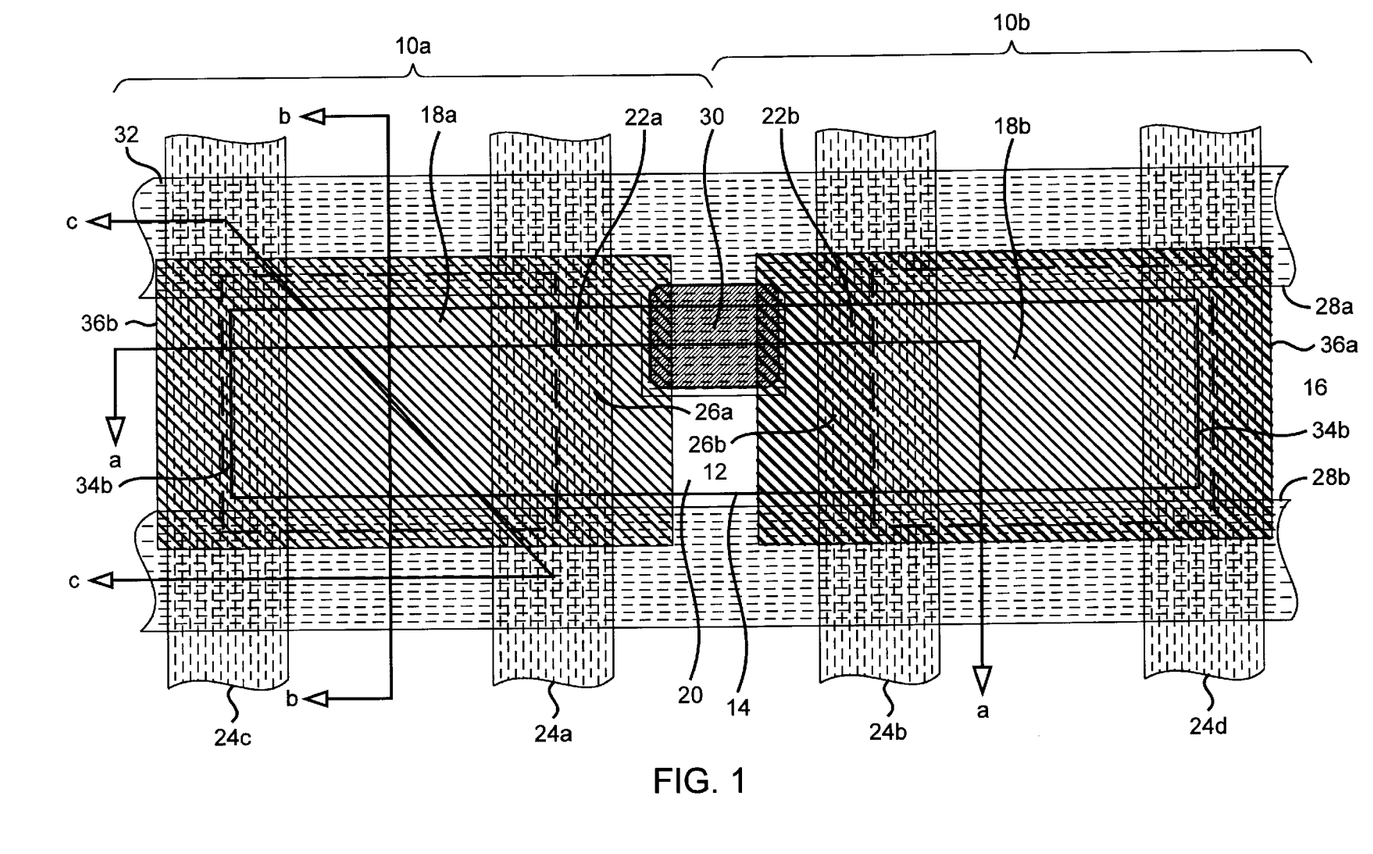
FIG. 1 is a top plan view illustrating a DRAM cell according to a preferred embodiment.

The active area 14 also includes N+ doped source regions (18a and 18b) and an N+ doped drain region 20. The drain region 20 is shared by both DRAM cells (10a and 10b). Situated between the source regions (18a and 18b) and the drain region 20 of each cell are P-type channel region (22a and 22b).

Word lines (24a–24d) composed of amorphous or polycrystalline silicon (referred to herein as "poly") are formed on the substrate 12. Word line 24a overlaps the channel region 22a and is isolated therefrom by a gate dielectric (not shown in FIG. 1) forming a gate member 26a. The gate member 26a, in conjunction with source region 18a, channel region 22a, and the common drain region 20, forms the access transistor for the DRAM cell 10a. In a like manner, word line 24b includes a gate member 26b, that forms the access transistor for DRAM cell 10b, together with source region 18b, channel region 22b, and the common drain region 20. Word lines 24c and 24d include the gate members for other cells (not shown) in the DRAM device.

A pair of bit lines (28a and 28b) are formed over the word lines (24a–24d). The bit lines (28a and 28b) are isolated from the word lines (24a–24d) by a first ILD (not shown in FIG. 1). In the preferred embodiment, the bit lines (28a and 28b) are formed from a second poly layer, and disposed generally perpendicular to the word lines (24a–24d). A portion of bit line 28a forms a buried contact 30 with the common drain region 20. Bit line 28b makes contact with other drain regions via a similar buried contact structure (not shown). The bit lines (28a and 28b) includes portions that run adjacent to the source region 18 of the DRAM cell 10a. These portions of the bit lines (28a and 28b) are referred to herein as "contact" portions 32 as they are situated adjacent, or proximate to the self-aligned capacitor contact of the cell.

Self-aligned capacitor contact holes (34a and 34b) are formed over the source regions of the DRAM cells (10a and 10b). The lateral extents of the capacitor contact holes (34a and 34b) are indicated by the dashed lines of FIG. 1. It is noted that the contact holes (34a and 34b) of each DRAM cell overlap its respective gate member (24a or 24b). In addition, the contact holes (34a and 34b) overlap the bit line contact portions 32 adjacent to their respective source region (18a or 18b). Thus, the contact holes (34a and 34b) are self-aligned with those portions of the word lines (24a–24d) and the bit lines (28a and 28b) that are adjacent to the source regions (18a and 18b).

Each DRAM cell (10a and 10b) includes a capacitor storage element (36a and 36b) (or first capacitor "plate") that makes contact with the source region (18a or 18b) of its respective cell. The storage elements (36a and 36b) are formed from a third poly layer that is isolated from the bit line poly layer by a second ILD (not shown in FIG. 1). A capacitor dielectric (not shown in FIG. 1) is formed over each storage element (36a and 36b). A capacitor plate (a "top" or "second" plate) (removed from FIG. 1 for clarity) is formed over the capacitor dielectric to complete the formation of the DRAM cells (10a and 10b).

Figure 2A:
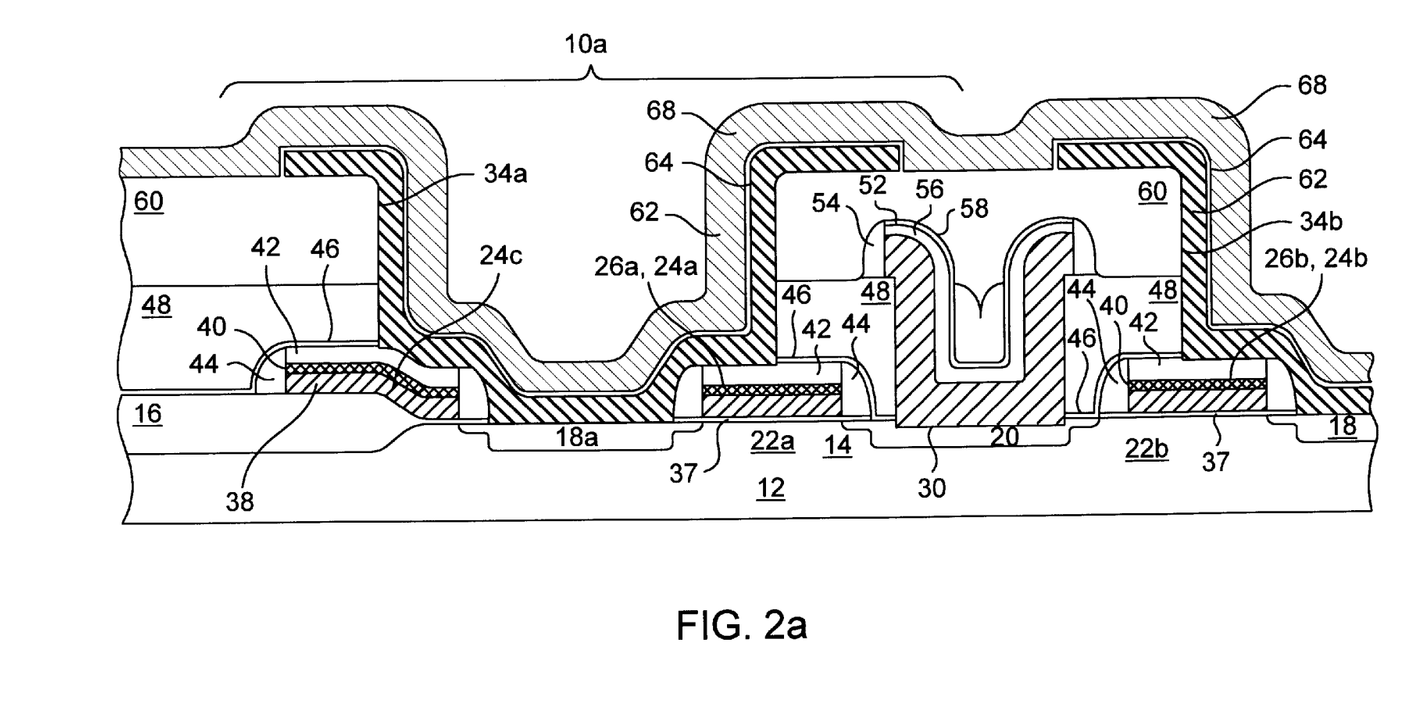
FIGS. 2a–2c are side cross sectional view of a DRAM cell taken along lines a—a, b—b, and c—c, respectively, of FIG. 1.
Figure 2B:
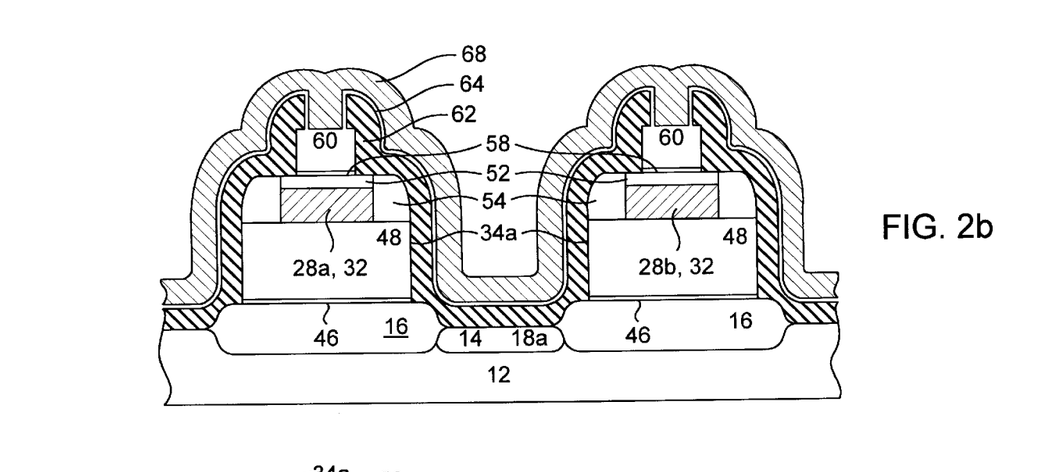
Figure 2C:
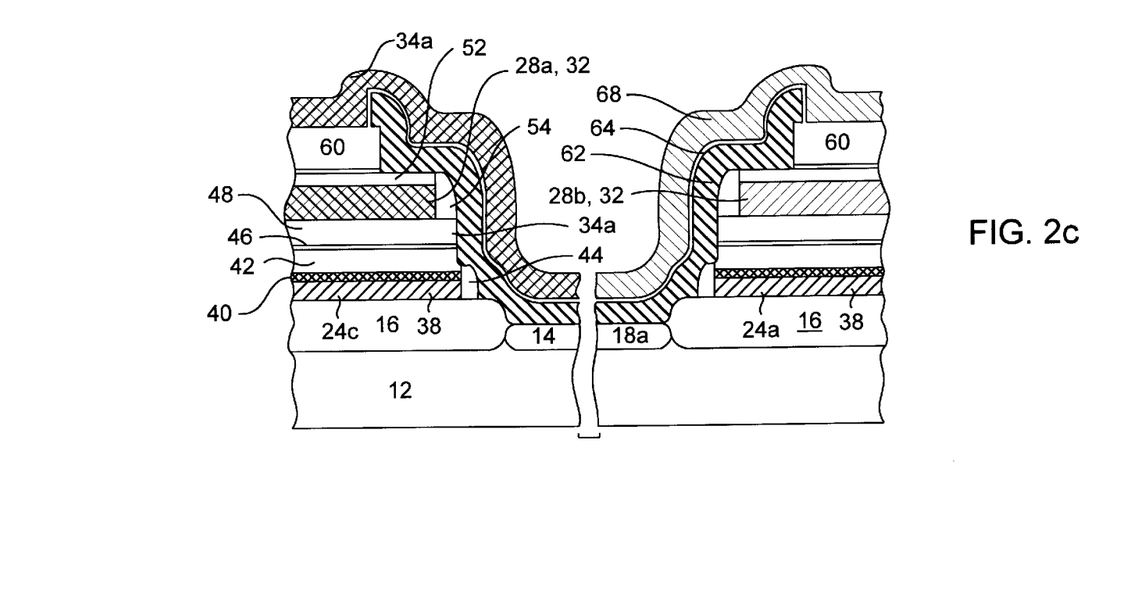

Referring now to FIGS. 2a–2c, a series of side cross sectional views are set forth illustrating the structure of a DRAM cell according to the preferred embodiment. FIG. 2a is a side cross sectional view taken along line a—a of FIG. 1 (along the access transistor "channel length" direction). FIG. 2b is a side cross sectional view taken along line b—b of FIG. 1 (through the capacitor contact along the "channel width" direction). FIG. 2c is a side cross sectional view taken along line c—c of FIG. 1 (through the capacitor contact in a generally diagonal direction). The cross sectional views of FIGS. 2a–2c include the general elements previously described. The DRAM cell 10a is formed in the N type substrate 12 that includes an active area 14 and isolation regions 16. Source region 18a, a portion of source region 18b, and drain regions 20 are shown formed in the active area 14. It is noted that the source and drain regions (18 and 20) have a lightly doped drain (LDD) structure. While the preferred embodiment sets forth LDD structures, it is understood that alternate embodiments could include drains that are medium doped non-LDD structures. The word lines (24a–24c) of the preferred embodiment are shown to be isolated from channel regions (22a and 22b) by a gate dielectric 37 and are multi-layered structures, including a first layer of doped poly (poly 1) 38 and a layer of tungsten silicide 40 (referred to herein simply as "silicide"). In the preferred embodiment the gate dielectric is silicon dioxide and has a thickness in the range of approximately 50–150 Å. The poly 1 has thickness of approximately 1,000 Å, and is doped with an N-type dopant at a concentration of approximately $10^{19}$–$10^{20}/cm^3$. The silicide has a thickness of about 750–1000 Å. As best set forth in FIGS. 2a and 2c, the word lines (24a–24c) are covered by an insulating layer on all surfaces. A first insulating layer 42 covers the top of the word lines (24a–24c) while the sides of the word lines (24a–24c) are covered by insulating first sidewall structures 44. In the preferred embodiment, the first insulating layer 42 and first insulating sidewall structures are formed from undoped silicon dioxide. The first insulating layer has a thickness of approximately 500 Å. The spacers have a width in the range of approximately 500–1000 Å. In an alternate embodiment, silicon oxynitride could be used to provide an insulating structure around the top and side surfaces of the word line.

An etch barrier layer 46 is formed over the word lines 24a–24c. The etch barrier layer 46 is removed in those places where a DRAM cell element makes contact with the DRAM cell access transistor (i.e., bit line contact to the transistor drain and capacitor contact to transistor source). In the case of the bit line buried contact 30, the etch barrier nitride 46 is removed at the location of the buried contact 30. In the case of the capacitor storage element 34, the etch barrier nitride 46 is removed where the self-aligned capacitor contact hole 34a overlaps the source region 18a and the word lines 24a and 24c. In the preferred embodiment, the etch barrier layer 46 is formed from silicon nitride and has a thickness of approximately 400 Å. In an alternate embodiment, silicon oxynitride could also be used to form the etch barrier layer.

The DRAM cell 10a includes a first ILD 48 formed over the etch barrier layer 46. In the preferred embodiment, the first ILD 48 is formed from a different material than the etch barrier layer 46, such that contacts can be formed by an etch that is selective to the ILD 48 over the etch barrier layer 46. The first ILD 46 serves the conventional function of isolating the poly 1 layer 38 from subsequently deposited conductive layers. The first ILD material of the preferred embodiment is composed of silicon dioxide, and is planarized, allowing for a thickness in the range of 2 k Å.

Referring once again to FIG. 2a, the buried contact 30 is shown extending through the first ILD 48 and the etch barrier layer 46 to the common drain region 20. The buried contact 30 allows bit line 28a to make contact with DRAM cells 10a and 10b. Data can be transferred to or from the cell capacitors through the access transistors by operation of word lines 24a or 24b. In the preferred embodiment, the bit lines (28a and 28b) are formed from a second layer of doped polysilicon (poly 2) 50. The poly 2 50 has thickness of approximately 1 k Å, and has a P+ dopant concentration of approximately $10^{19}$–$10^{20}/cm^3$. Like the word lines (24a–24c), the bit lines (28a and 28b) are surrounded by an insulating structure that includes a second insulating layer 52 and second sidewall structures 54. In the preferred embodiment, the second insulating layer 52 is multi-layered, having a bit line oxide layer 56 formed over the poly 2 50, and a bit line nitride layer 58 formed over the bit line oxide layer 56. The second sidewall structures 54 are composed of silicon nitride. It is noted that the second insulating layer material of the preferred embodiment, like that of the etch barrier layer, is chosen so that the contact etch used to open the first ILD 48 is not selective to the second insulating layer 52 or the second sidewall structures 54. In the preferred embodiment, the bit line nitride layer 58 has a thickness of about 1,000 Å, while the bit line oxide layer 56 has a thickness of about 700 Å. In an alternate embodiment, the second insulating layer and sidewall structures could be formed from silicon oxynitride.

A second ILD 60 covers the bit lines (28a and 28b), except for those portions of the bit line that are overlapped by the self-aligned capacitor contact holes (34a and 34b). This is best illustrated in FIGS. 2b and 2c, where part of the second ILD 60 that covers the bit lines (34a and 34b) has been partially removed. In the preferred embodiment, the second ILD 60 is formed from a similar material as the first ILD 48, allowing both ILDs (48 and 60) to be etched by the same type of etch. The second ILD 60 isolates the poly 2 layer 50 from subsequently deposited conductive layers. The second ILD material of the preferred embodiment is silicon dioxide, and like the first ILD material, is planarized, allowing for a minimal thickness of approximately 4 k Å over the poly 2 layer 50.

The self-aligned capacitor contact holes (34a and 34b) extend through both ILDs (48 and 60) and the etch barrier layer 46, to the source regions (18a or 18b) of their respective DRAM cells (10a or 10b). Further, as set forth in FIGS. 1 and 2a, capacitor contact hole 34a overlaps portions of word lines 24a and 24c. In those places of overlap, the first and second ILD (48 and 60) and etch barrier layer 46 have been removed, exposing the first insulating layer 42 and first sidewall structures 44. Similarly, as shown best in FIGS. 2b and 2c, the capacitor contact holes (34a and 34b) overlap portions of the bit lines (28a and 28b). In those places of overlap, the second ILD 60 and bit line nitride layer 58 have been removed, exposing the bit line oxide layer 56 and the second sidewall structures 54. The capacitor storage elements (36a and 36b) extend into their capacitor contact holes (34a and 34b) and make contact with the source regions (18a and 18b) in the substrate. Due to the self-aligned nature of the capacitor contact holes (34a and 34b), the capacitor storage elements (36a and 36b) are insulated from the word lines (24a–24d) by the first insulating layer 42 and first sidewall structures 44. In the same manner, the capacitor storage elements (36a and 36b) are insulated from the bit lines by the bit line oxide layer 56 and the second sidewall structures 54. Further, in the preferred embodiment, the self-aligned capacitor contacts (34a and 34b) increase the area of the storage elements (36a and 36b), resulting in storage nodes having increased capacitance. The capacitor storage elements (36a and 36b) are fabricated from a third layer of doped polysilicon (poly 3) 62. The poly 3 62 has a thickness of approximately 1–2 k Å and has a dopant concentration in the general range of $10^{19}$–$10^{20}/cm^3$.

The capacitor dielectric 64 is shown in FIGS. 2a–2c to cover the top and side surfaces of the capacitor storage elements (34a and 34b). In the preferred embodiment, the capacitor dielectric 64 is a sandwich layer of silicon dioxide-silicon nitride-silicon dioxide (referred herein as "ONO"). The bottom layer of silicon dioxide is native oxide having a thickness in the general range of 10–20 Å. The middle nitride layer has a thickness in the general range of 40–50 Å. The top layer of silicon dioxide has a thickness in the general range of 10–30 Å. Of course, the particular type of dielectric should not be construed as limiting the present invention thereto. A top capacitor plate 68 extends over the capacitor dielectric 64, completely covering the DRAM cells (10a and 10b). In the preferred embodiment, the top capacitor plate 68 is formed from a fourth layer of polysilicon (poly 4) 68. The poly 4 68 has a thickness of approximately 500 Å and has a dopant concentration of approximately $10^{19}$–$10^{20}/cm^3$.

Figure 3:
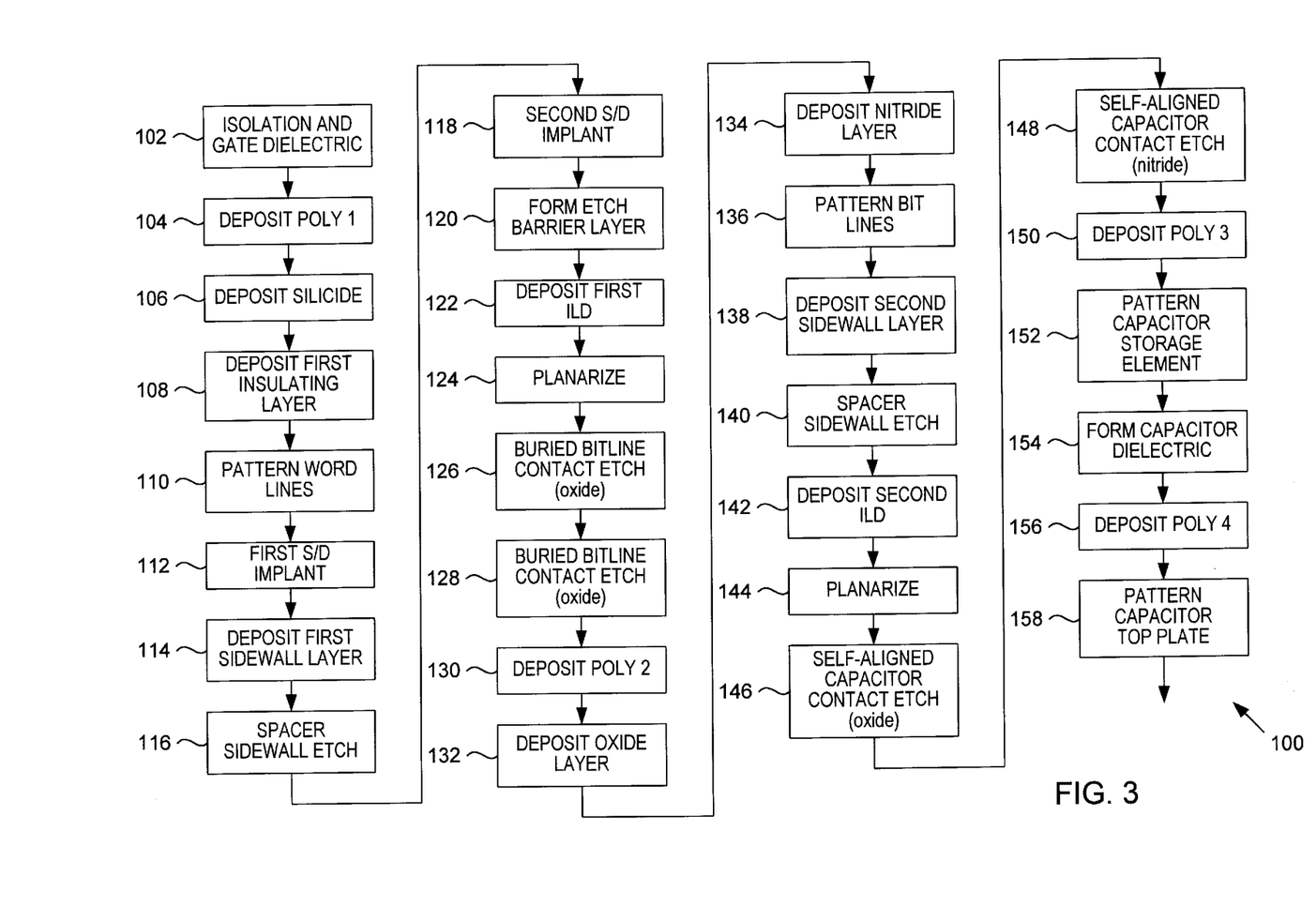
FIG. 3 is a flow chart illustrating a method of fabricating a DRAM according a preferred embodiment of the present invention.
Figure 4A:
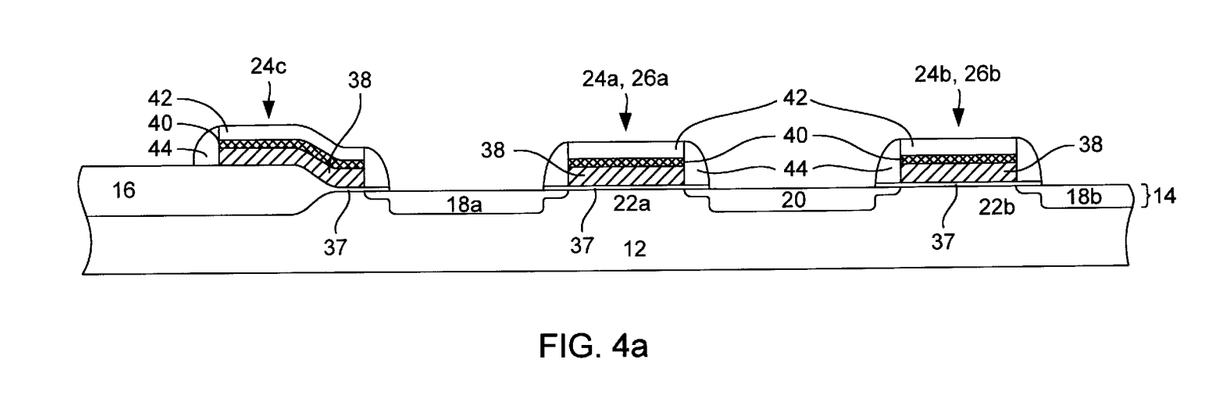
FIGS. 4a–4c through 11a–11c are a series of side cross sectional views taken along lines a—a, b—b, and c—c of FIG. 1, illustrating a method of fabricating a DRAM cell according to the preferred embodiment.
Figure 4B:
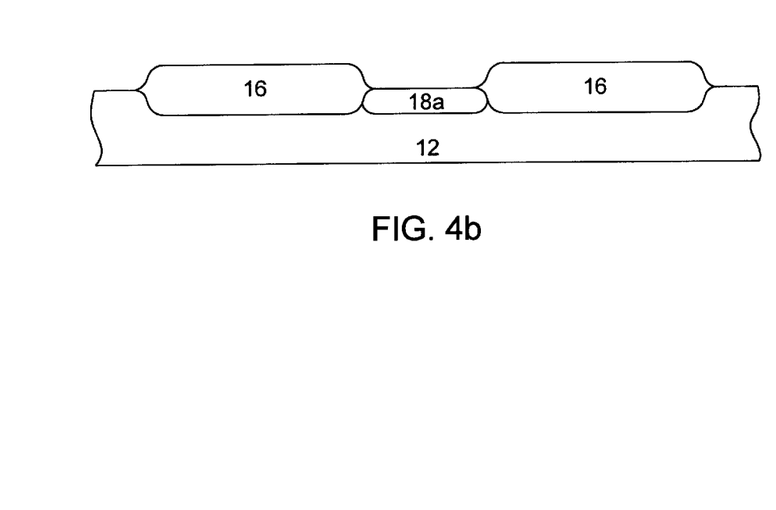
Figure 4C:
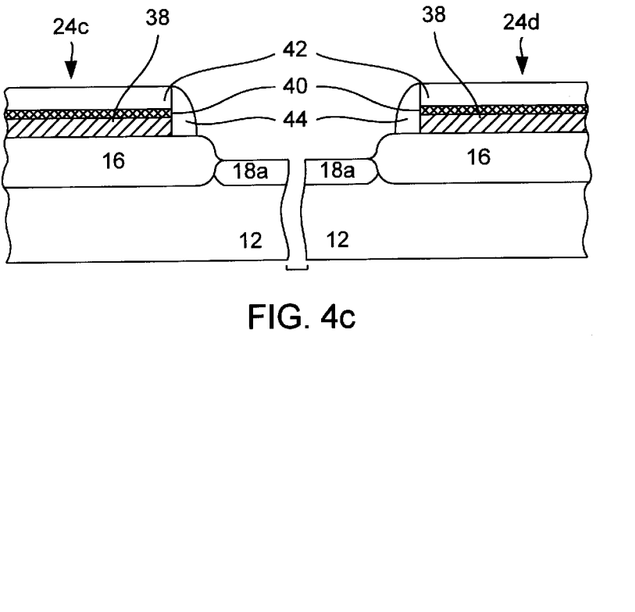

Referring now to FIG. 3 in conjunction with FIGS. 4a–4c through 11a–11c, a flowchart and a series of side cross sectional views are set forth, illustrating the fabrication of a DRAM cell according to a preferred embodiment of the present invention. The side cross sectional views correspond to those set forth in FIGS. 2a–2c. The fabrication process is designated by the general reference character 100, and set forth generally in FIG. 3. The process 100 begins with a number of conventional fabrication steps. The semiconductor substrate is subjected to an isolation and gate oxide formation step (step 102). In the preferred embodiment, isolation is accomplished using conventional local oxidation of silicon techniques resulting in isolation regions 16 of thick thermally grown silicon dioxide. A gate dielectric is then formed by thermally growing silicon dioxide on the active areas 14.

Following step (102), poly 1 38 is deposited on the substrate (step 104). The poly 1 38 is either doped during deposition (in situ doping), or deposited and then doped by way of ion implantation. The layer of poly 1 38 undergoes a conventional tungsten silicide deposition (e.g. using dichlorosilane) (step 106), which forms the layer of tungsten silicide 40 over the poly 1 38. The first insulating layer 42 is subsequently deposited (step 108) over the silicide 40. In the preferred embodiment, the oxide layer over the word lines is formed by deposition, such as TEOS.

Once the composite layer of poly 1 38, silicide 40, and first insulating layer 42 have been formed over the substrate 12, an etch mask (not shown) is formed using conventional photolithographic techniques, and word lines (24a–24d) are patterned (step 110) by an anisotropic etch. In the preferred embodiment, the word lines (24a–24d) are patterned using dry etching, such as reactive ion etching (RIE). A first source/drain (S/D) implant (step 112) follows the formation of the word lines to create the initial source and drain regions (18a, 18b and 20) in the substrate 12. In the preferred embodiment, the N-type dopant is P+31, and implantation is at an energy in the range of 30–40 keV with a dose of approximately $5E13/cm^2$.

To complete the protective insulation of the word lines (24a, 24b and 24c), a sidewall dielectric layer is then deposited over the word lines (step 114) and then subject to a sidewall forming etch (step 116) (also referred to as a "spacer etch"). The sidewall etch creates the first insulating sidewall structures 44 on the side surfaces of the word lines (24a–24c), and also clears the surface of the active area 14 of any gate dielectric 37.

A second S/D implant (step 118) completes the formation of the source and drain regions (18a, 18b and 20). In the preferred embodiment, the second implant N-type dopant is As, and implantation is at an energy in the range of 80 keV with a dose of approximately $5E15/cm^2$. The DRAM cells (10a and 10b) following the second S/D implant (118) are set forth in FIGS. 4a–4c.

Figure 5A:
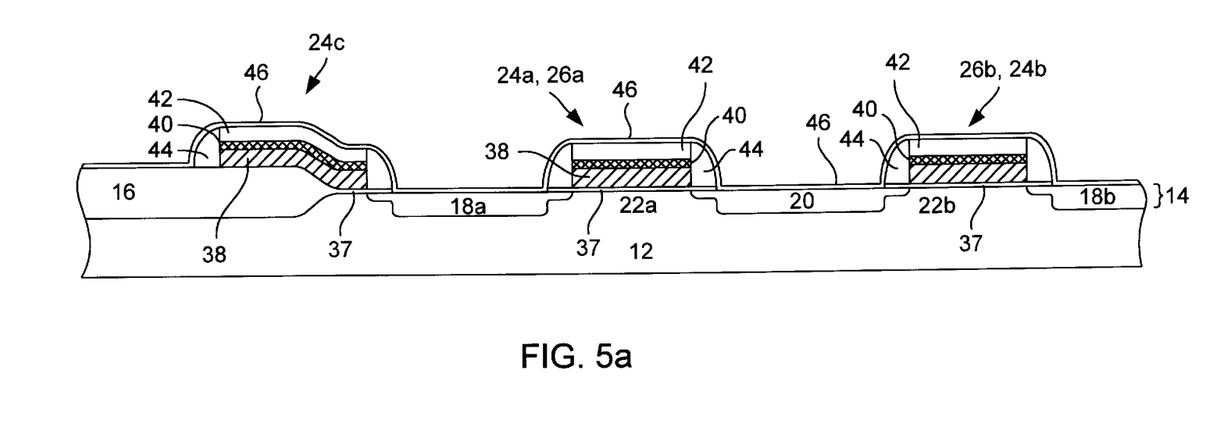
Figure 5B:
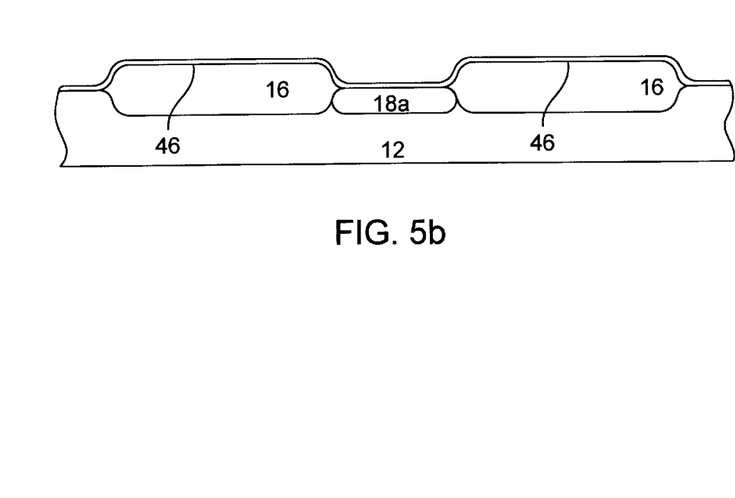
Figure 5C:
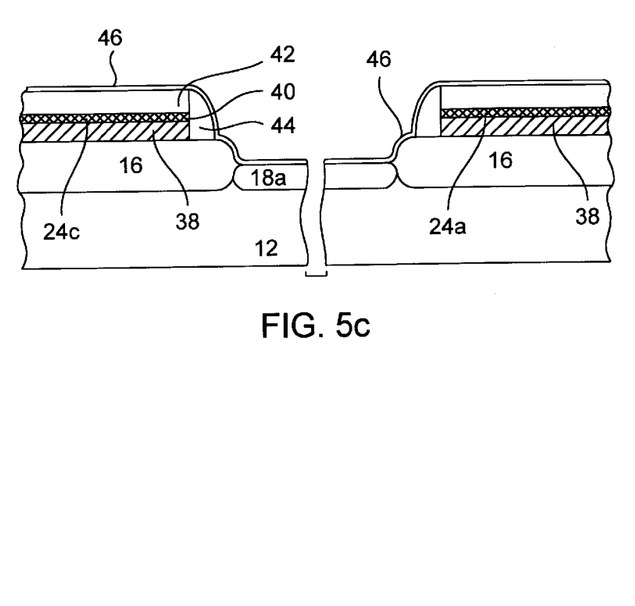

After the formation of the word lines (24a–24c) and source and drain regions (18a, 18b and 20), the etch barrier layer 46 is formed (step 120) over the entire surface of the DRAM device, including the word lines (24a–24c) and the source and drain regions (18a, 18b and 20). In the preferred embodiment the etch barrier layer 46 is deposited using chemical vapor deposition (CVD) techniques. The DRAM cells (10a and 10b) following the deposition of the etch barrier layer 46 are set forth in FIGS. 5a–5c. It is noted that in the preferred embodiment, in those regions peripheral to the array, the etch barrier layer is removed by a periphery etch step (not shown in FIG. 3).

Figure 6A:
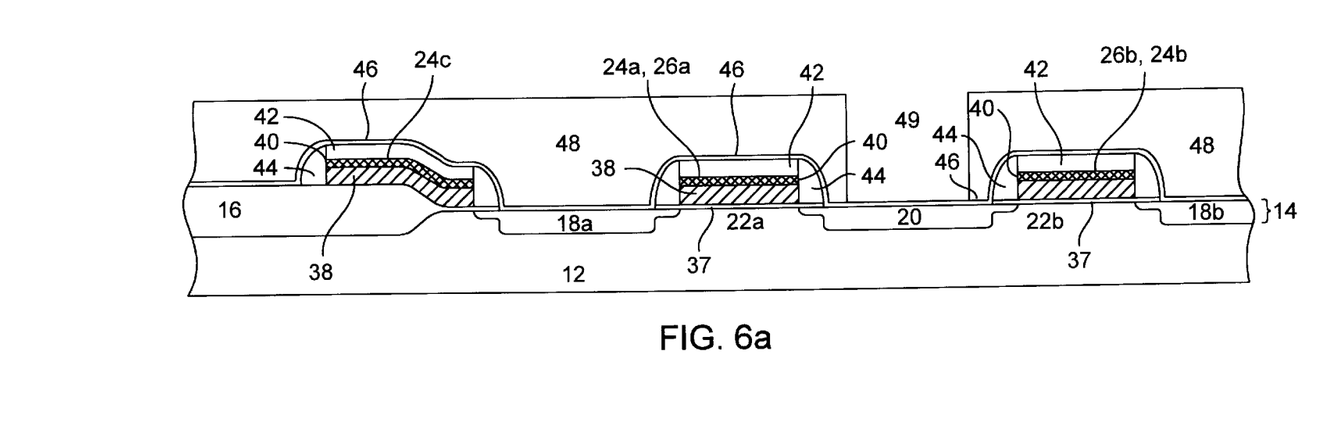
Figure 6B:
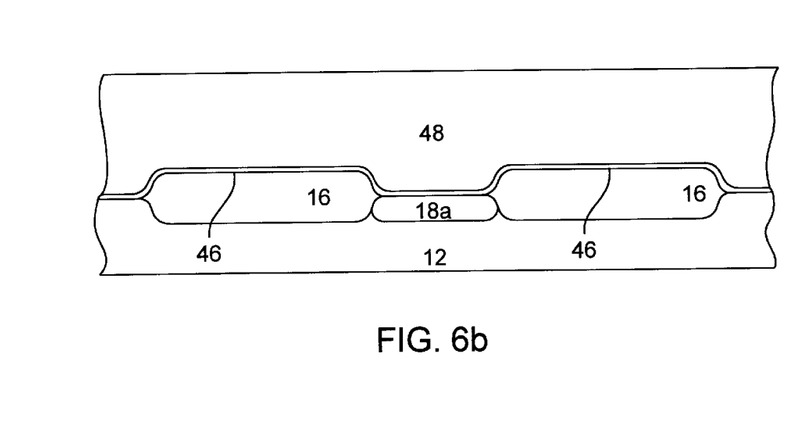
Figure 6C:
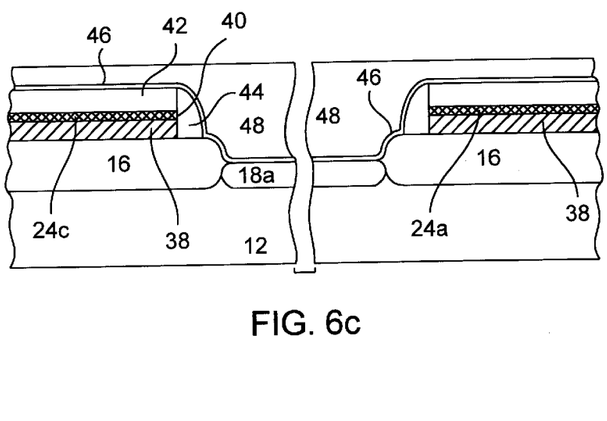

The first ILD 48 is then deposited over the etch barrier layer 46 (step 122). In the preferred embodiment the first ILD 48 is deposited using low temperature techniques, such as TEOS deposition. The first ILD 48 is then planarized (step 124) using either reflow technique or chemical-mechanical polishing (CMP). Once planarization is complete, a buried contact hole 49 is etched through the first ILD 48 to the drain region 20. In the preferred embodiment, the buried contact etch is a two step process, including an oxide etch (step 126) and a nitride etch (step 128). The buried contact etch begins with the formation of an etch mask (not shown) over the planarized first ILD 48. The etch mask is created using conventional photolithographic techniques, and results in a layer of photoresist that covers the DRAM cells (10a and 10b) but leaves a portion of the drain region 20 exposed. The buried contact oxide etch (step 126) is selective to nitride and etches through the first ILD 48 to the etch barrier layer 46. Because the oxide etch (step 126) is selective to the nitride making up the etch barrier layer 46, it essentially stops at the etch barrier layer 46. In the preferred embodiment the BC etch is a dry etch such as RIE. The DRAM cells (10a and 10b) following the buried contact oxide etch (step 126) are set forth in FIGS. 6a–6c.

Figure 7A:
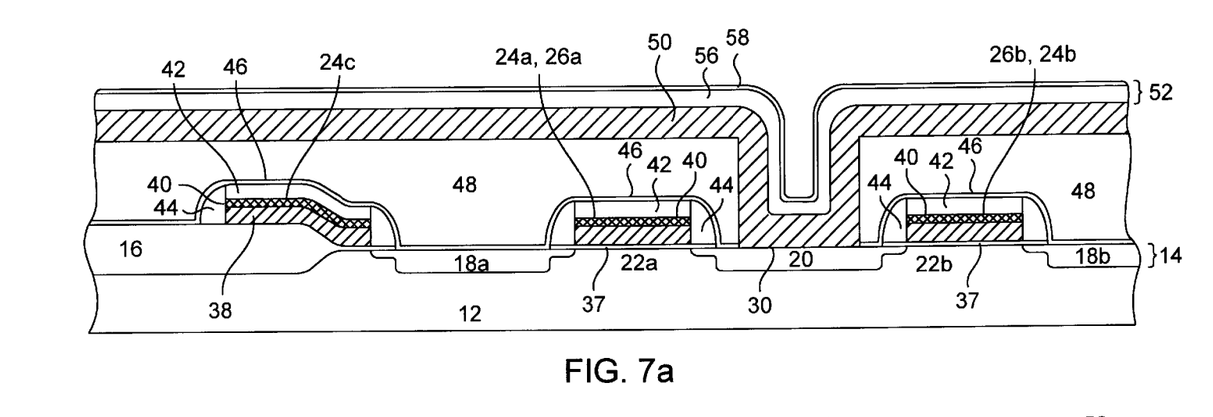
Figure 7B:
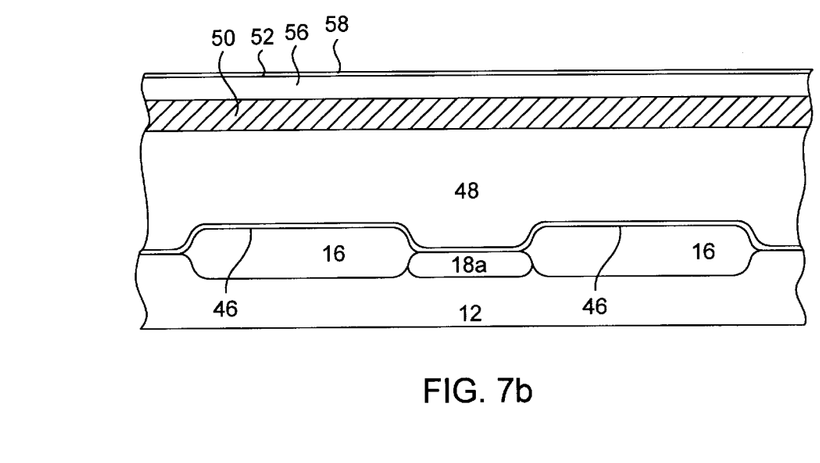
Figure 7C:
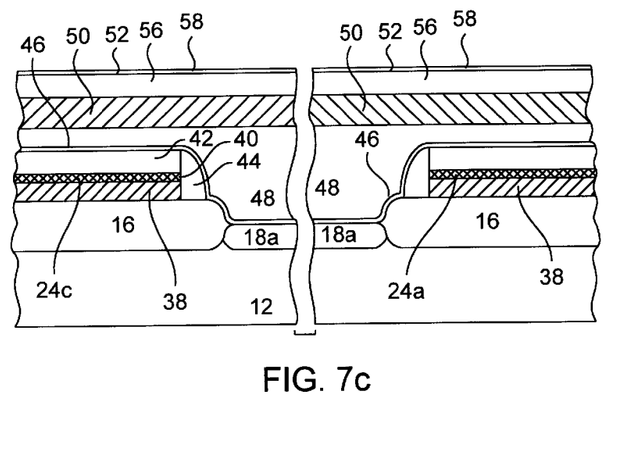

The buried contact nitride etch (step 128) clears that portion of the nitride at the bottom of the buried contact hole 49 in order to allow contact with drain region 20. In the preferred embodiment, the buried contact nitride etch is accomplished with a dry etch, such as RIE. After the buried contact nitride etch completes the formation of the buried contact hole 49, a poly 2 layer 50 is deposited (step 130) so as to extend into the hole and form the buried contact 30 therein. The second insulating layer 52 is then formed over the poly 2 layer 50. The step of forming the second insulating layer includes the deposition of the bit line oxide layer (step 132) and the deposition of a bit line nitride layer (step 134). In the preferred embodiment, the bit line oxide layer is formed by TEOS deposition. The bit line nitride layer is formed by CVD techniques. The DRAM cells (10a and 10b) following the deposition of bit line nitride layer (134) are set forth in FIGS. 7a–7c.

Figure 8A:
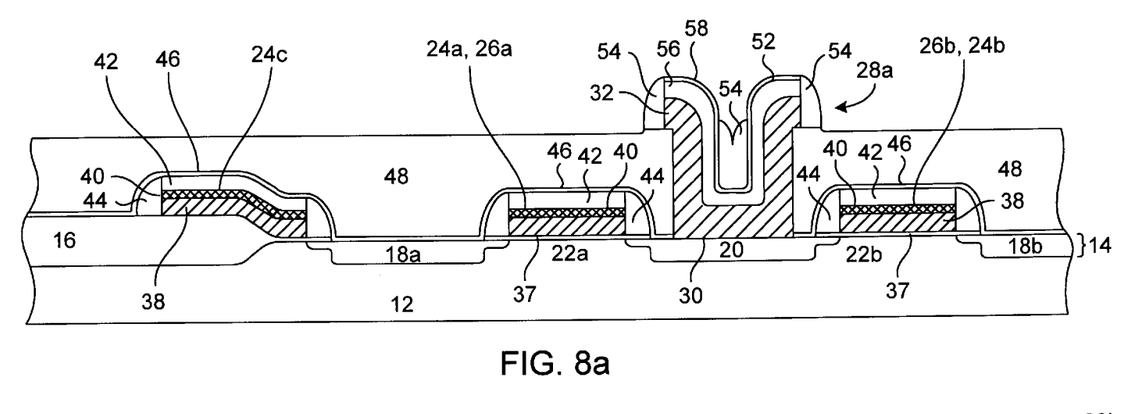
Figure 8B:
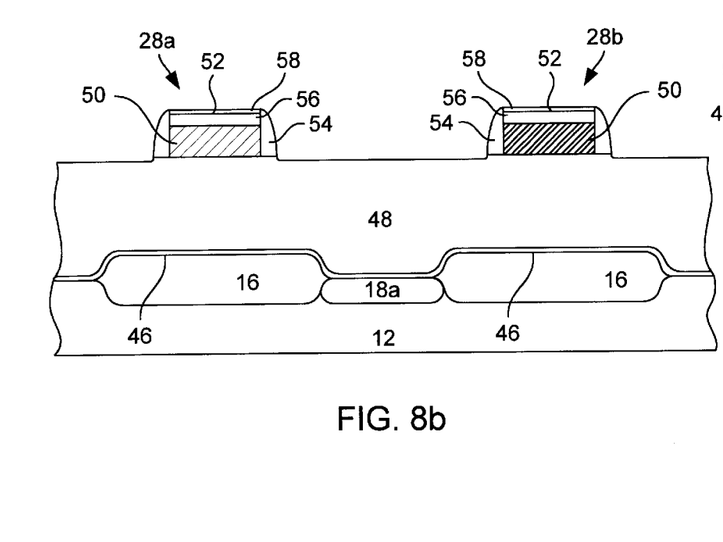
Figure 8C:
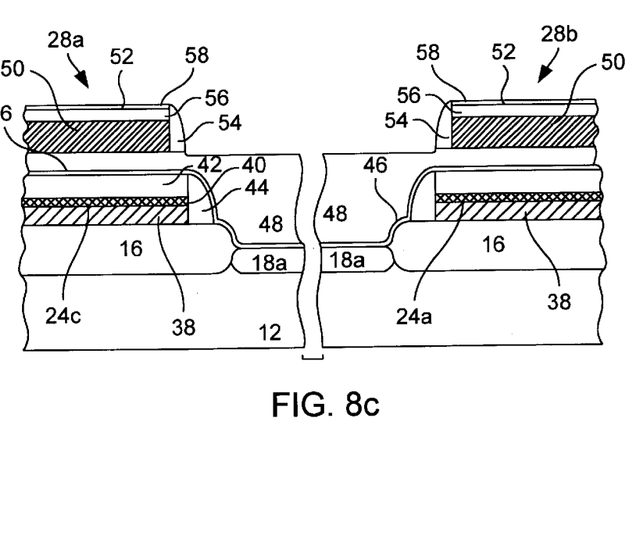

The composite poly 2/oxide/nitride formation is etched (step 136) to form initial bit line structures. An etch mask (not shown) is formed on the bit line nitride layer 58 and an anisotropic etch applied. The preferred etch method is RIE. A second sidewall dielectric layer is then deposited (step 138) over the resulting bit line structures. The second sidewall dielectric layer is subjected to a sidewall etch (step 140) to form second sidewall structures 54 on the side surfaces of the bit line structures. In the preferred embodiment, the sidewall insulating layer is obtained using CVD nitride deposition and anisotropic etching to leave the spacers on the sides. The DRAM cells (10a and 10b) following the second sidewall etch step (step 140) are set forth in FIGS. 8a–8c.

Once the bit lines are complete, the second ILD 60 is deposited (step 142) over the bit lines (28a and 28b) and planarized (step 144). In the preferred embodiment the second ILD 60 is formed by TEOS deposition and planarized by CMP.

Figure 9A:
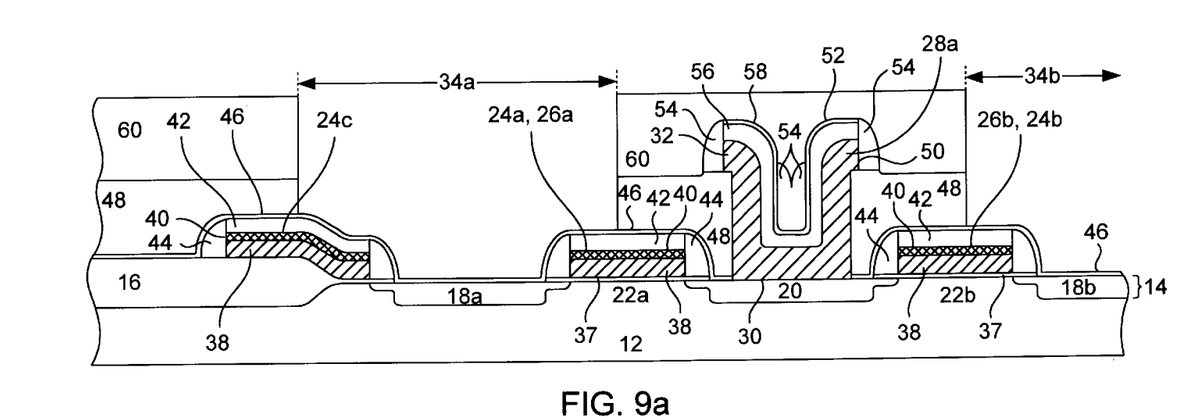
Figure 9B:
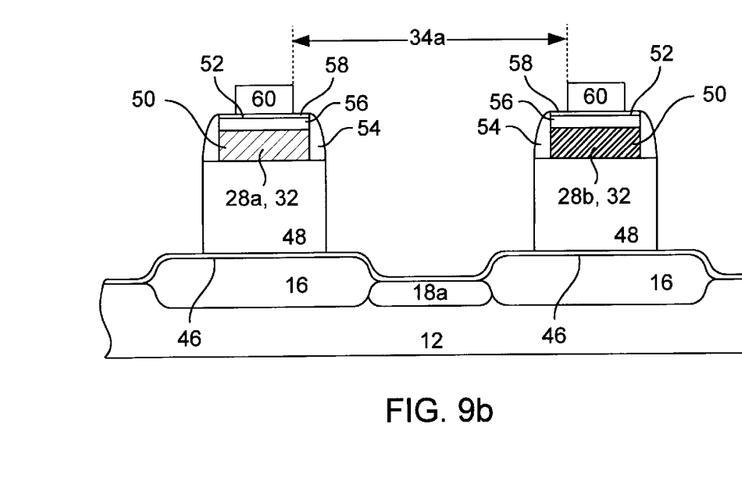
Figure 9C:
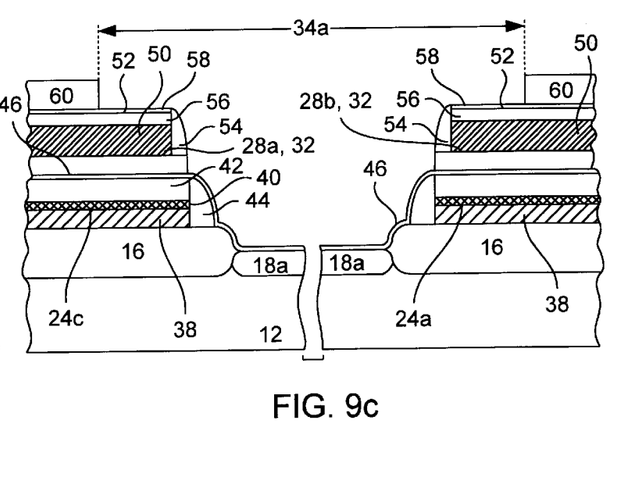

Following formation of the second ILD 60 A capacitor contact etch is used to create the self-aligned capacitor contact holes (34a and 34b). In the preferred embodiment, the capacitor contact etch is a two step process including an oxide etch (step 146) and a nitride etch (step 148). Conventional photolithographic techniques are used to create an etch mask (not shown) over the DRAM cells (10a and 10b) which includes openings over the source regions (18a and 18b). In the preferred embodiment, the etch mask openings also overlaps the portions of the bit lines (28a and 28) that are adjacent to the source regions (bit line contact portions 32), and the portions of the word lines (24a–24c) that are adjacent to the source regions (including the gate members 26a and 26b). The capacitor contact oxide etch (step 146) then clears away the portions of the first and second ILD (48 and 60) below the etch mask opening. The oxide etch (step 146) stops on the etch barrier layer 46, as it is selective to nitride. The DRAM cells (10a and 10b) following the oxide etch (step 146) are set forth in FIGS. 9a–9c. Notably, the etch barrier layer 46 has protected the word line insulating structures (first insulating layer 42 and first sidewall structures 44) from the oxide etch (step 146). Further, as best shown in FIGS. 9b and 9c, the combination of the second insulating layer 52 (because of the bit line nitride layer 58) and the second sidewall structures 54, has protected the bit lines (28a and 28b) from the same oxide etch (step 146). In the preferred embodiment the capacitor contact oxide etch is a dry etch.

The capacitor contact nitride etch (step 148) clears the etch barrier layer at the bottom of the contact holes (34a and 34b). Because the capacitor contact nitride etch (step 148) is selective to oxide, the first insulating layer 42 and first sidewall structures 44 surrounding the word lines (24a–24b) remain substantially intact, ensuring that the word lines (24a–24b) are not exposed in the capacitor contact etch process. In a similar manner, while the nitride etch (step 148) removes the bit line nitride layer 58, the bit line oxide layer 56 remains intact. It is noted that the second sidewall structures 54, though affected by the nitride etch (step 148), have sufficient thickness to maintain insulation of the bit lines (28a and 28b). In an alternate embodiment of the present invention, the second insulating layer, instead of having a composite nitride/oxide structure, could be composed solely of nitride. In such an arrangement, the second insulating layer would have to be sufficiently thick enough to ensure bit line insulation following the contact nitride etch (step 148). In the preferred embodiment, the nitride etch is accomplished by RIE.

Figure 10A:
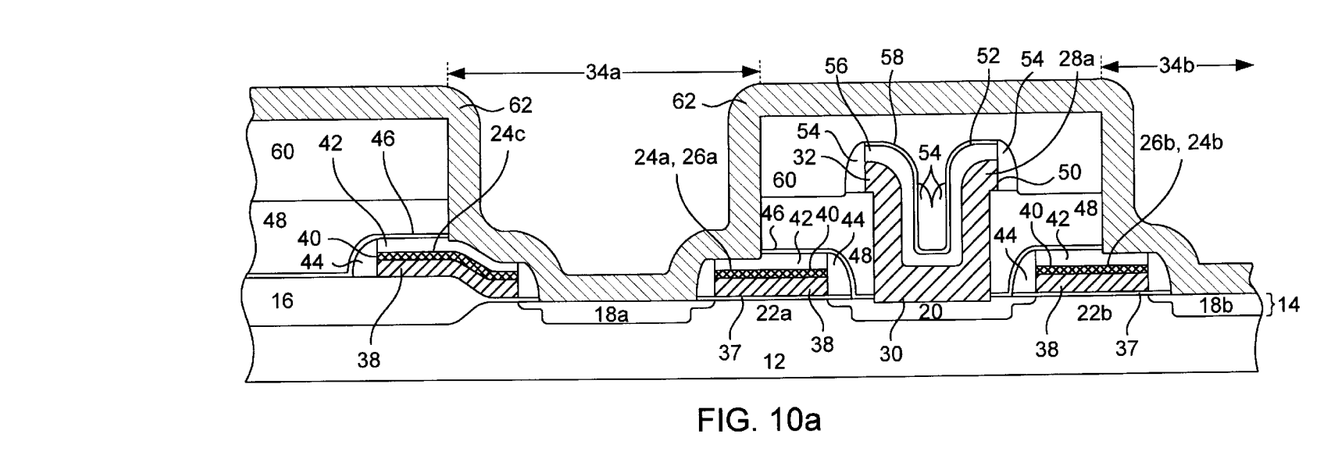
Figure 10B:
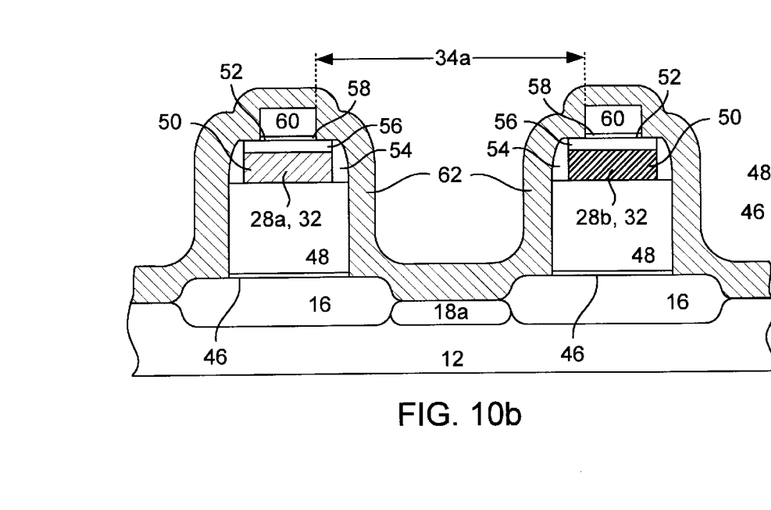
Figure 10C:
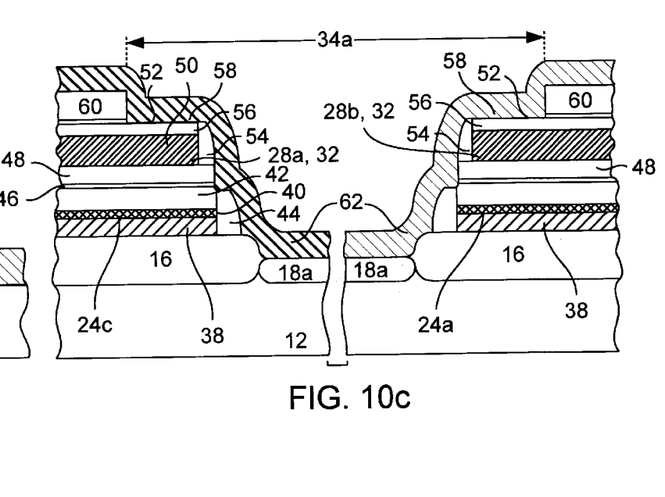
Figure 11A:
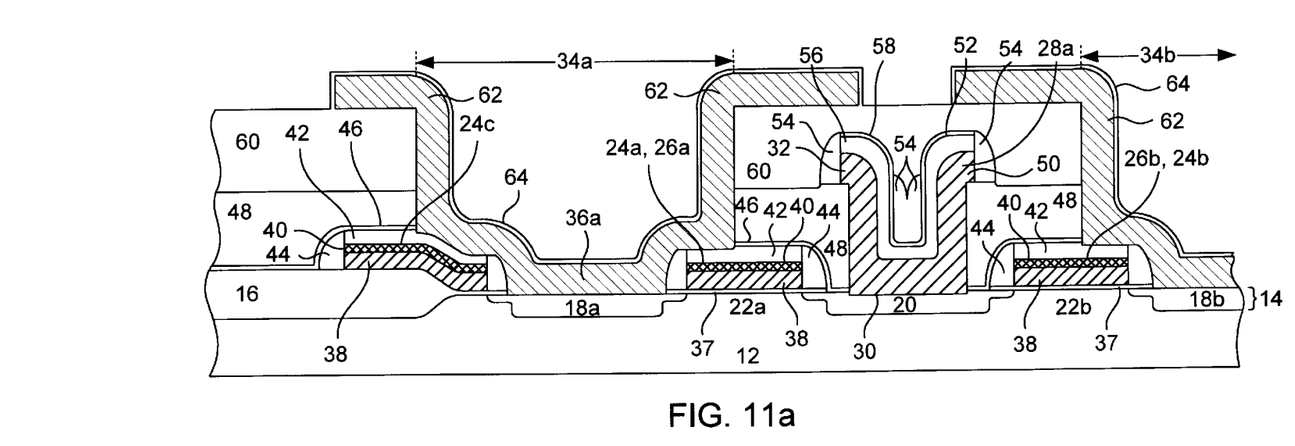
Figure 11B:
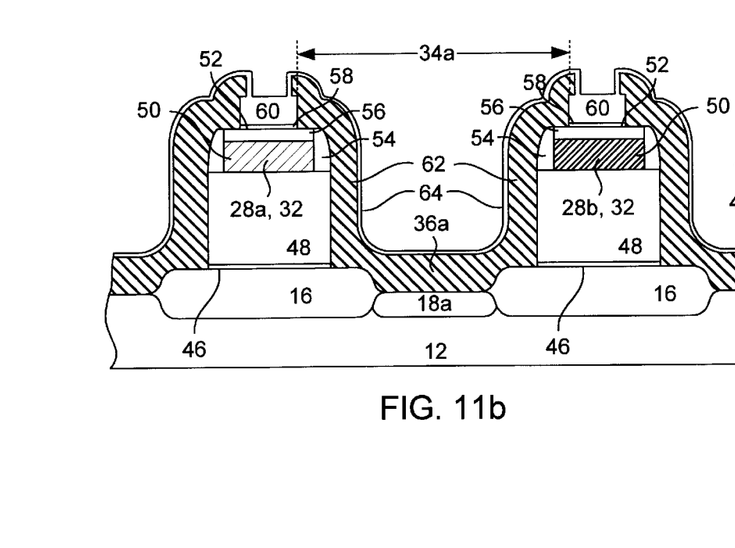
Figure 11C:
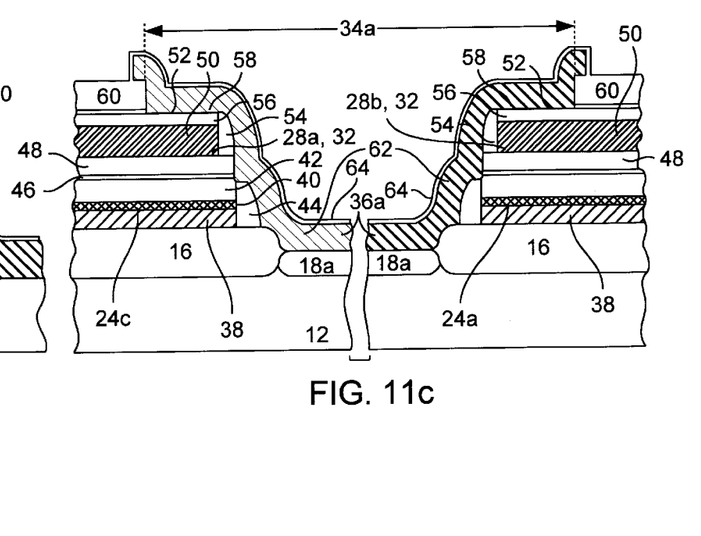

Following the capacitor contact etch (steps 146 and 148) the formation of the cell capacitor begins by laying down a conductive layer that will serve as the storage node for the capacitor. In the preferred embodiment this is accomplished with the deposition of a poly 3 layer (step 150). The poly 3 62 covers the second ILD 60 and extends into the contact holes (34a and 34b) to make contact with the source regions (18a and 18b). In the preferred embodiment, the poly 3 is deposited and doped by in situ techniques. The DRAM cells (10a and 10b) following the deposition of the poly 3 layers is set forth in FIGS. 10a–10c. Within the contact holes (34a and 34b), the word lines (24a–24c) are insulated from the poly 3 layer 62 by the first insulating layer 42 and first insulating sidewall structures 44. The bit lines (28a and 28b) are insulated from poly 3 62 by the bit line oxide layer 56 and the second sidewall structures 54.

The poly 3 62 is then patterned (step 152) to form the capacitor storage elements (36a and 36b). An etch mask (not shown) is created over the poly 3 layer 62, and an anisotropic etch applied. The preferred poly 3 is a dry etch. The capacitor dielectric 64 (ONO) is then formed over the capacitor storage elements (36a and 36b) (step 154). The initial silicon dioxide layer is a native oxide. The middle nitride layer is then deposited using chemical vapor deposition at approximately 650–700° C. The final silicon dioxide layer is formed by oxidizing the middle nitride layer. Oxidation is a wet oxidation carried out at a temperature in the range of 850° C. for approximately 15 minutes. The DRAM cells (10a and 10b) following the formation of the capacitor dielectric are set forth in FIGS. 11a–11c.

The poly 4 layer 68 is deposited over the capacitor dielectric (step 156) and then patterned (step 158) to create the capacitor top plate 66. The preferred poly 4 deposition method includes in situ doping of the polysilcon layer. The poly 4 is patterned using a dry etch. The DRAM cells (10a and 10b) following the formation of the capacitor top plate 66 are set forth in FIGS. 2a–2c. As indicated in FIG. 3, by the arrow following step 158, the fabrication of the DRAM device continues with conventional secondary interconnect and insulation layers (not shown).

It is understood that the embodiment set forth herein are only some of the possible embodiments of the present invention, and that the invention may be changed, and other embodiments derived, without departing from the spirit and scope of the invention. Accordingly, the invention is intended to be limited only by the appended claims.

What is claimed is:

1. A dynamic random access memory (DRAM) cell, comprising:
    an access transistor formed on a substrate, the access transistor having a first terminal, a second terminal, and a gate, the gate being fabricated from a first conductive layer, the gate containing at least one word line;
    at least one bit line coupled to the first terminal of the access transistor, the bit line being fabricated from a second conductive layer;
    an etch barrier layer formed between the first conductive layer and the second conductive layer;
    a first interlayer dielectric formed between the etch barrier layer and the second conductive layer, the first interlayer dielectric for providing vertical insulation between the first conductive layer and the second conductive layer;
    a second interlayer dielectric formed between the second conductive layer and a third conductive layer, the second interlayer dielectric for providing vertical insulation between the second conductive layer and the third conductive layer; and
    a capacitor disposed over the second terminal, the capacitor including a capacitor contact extending through the first interlayer dielectric and the second interlayer dielectric and in contact with the second terminal, the capacitor contact being self-aligned with the gate of the access transistor and the bit line, the capacitor being formed from at least the third conductive layer.

2. The dynamic random access memory (DRAM) cell of claim 1 further comprising:
    a gate insulating structure surrounding the gate.

3. The dynamic random access memory (DRAM) cell of claim 2, wherein:
    the gate insulating structure includes gate insulating sidewall structures; and
    the capacitor contact is insulated from the gate by at least the gate insulating sidewall structures.

4. The dynamic random access memory (DRAM) cell of claim 1 further comprising:
    a bit line insulating structure formed over the bit line.

5. The dynamic random access memory (DRAM) cell of claim 4, wherein:
    the bit line insulating structure includes bit line insulating sidewall structures; and
    the capacitor contact is insulated from the bit line by at least the bit line insulating sidewall structures.

* * * * *